Figure 1:
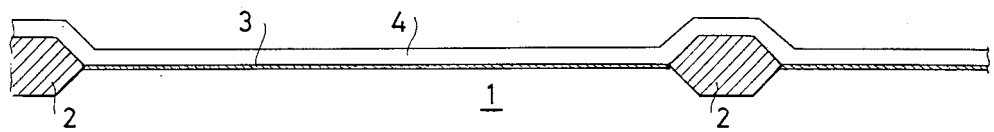

United States Patent [19]

Maggioni et al.

[11] Patent Number: 4,780,431

[45] Date of Patent: Oct. 25, 1988

[54] PROCESS FOR MAKING STRUCTURES INCLUDING E2PROM NONVOLATILE MEMORY CELLS WITH SELF-ALIGNED LAYERS OF SILICON AND ASSOCIATED TRANSISTORS

[75] Inventors: Franco Maggioni, Missaglia; Carlo Riva, Monza, both of Italy

[73] Assignee: SGS Microellettronica S.p.A., Italy

[21] Appl. No.: 69,183

[22] Filed: Jul. 2, 1987

[30] Foreign Application Priority Data

Jul. 25, 1986 [IT] Italy ................. 21254A/86

[51] Int. Cl.$^4$ .......................................... H01L 21/441
[52] U.S. Cl. ........................................ 437/52; 437/43; 437/44; 437/190
[58] Field of Search ................. 437/43, 44, 52, 190

[56] References Cited

U.S. PATENT DOCUMENTS

| | | | |
|---|---|---|---|
| 4,178,674 | 12/1979 | Liu et al. | 437/52 X |
| 4,180,826 | 12/1979 | Shappir | 437/52 X |
| 4,373,249 | 2/1983 | Kosa et al. | 437/52 X |
| 4,420,871 | 12/1983 | Scheibe | 437/52 X |
| 4,426,764 | 1/1984 | Kosa et al. | 437/52 X |
| 4,495,693 | 1/1985 | Iwahashi et al. | 437/52 |
| 4,517,732 | 5/1985 | Oshikawa | 437/52 X |
| 4,597,159 | 7/1986 | Usami et al. | 437/52 |
| 4,598,460 | 7/1986 | Owens et al. | 437/52 X |
| 4,612,212 | 9/1986 | Masuoka | 437/52 |
| 4,719,184 | 1/1988 | Cantarelli et al. | 437/52 X |
| 4,735,919 | 4/1988 | Faraone | 437/43 |

Primary Examiner—George T. Ozaki
Attorney, Agent, or Firm—Gerald J. Ferguson, Jr.

[57] ABSTRACT

The process provides for obtaining in the areas intended for the formation of the transistors windows in the intermediate oxide layer between the two silicon layers and, before final etching of the two silicon layers and the intermediate oxide, application of a mask formed in such a manner as to superimpose on the second silicon layer in the transistor areas coverings wider than the corresponding windows of the intermediate oxide layer.

5 Claims, 3 Drawing Sheets

PROCESS FOR MAKING STRUCTURES INCLUDING E2PROM NONVOLATILE MEMORY CELLS WITH SELF-ALIGNED LAYERS OF SILICON AND ASSOCIATED TRANSISTORS

DESCRIPTION

The present invention relates to a process for making structures including E$^2$PROM nonvolatile memory cells with self-aligned layers of silicon and associated transistors.

An E$^2$PROM nonvolatile memory cell is known to comprise a floating gate of polycrystalline silicon superimposed on a layer of gate oxide superimposed in turn on a substrate of monocrystalline silicon appropriately doped and a control gate of polycrystalline silicon in turn superimposed on the floating gate and insulated electrically from the latter by a thin layer of silicon oxide.

With the cell is associated a selection transistor formed of two superimposed uninsulated layers of polycrystalline silicon placed over the gate oxide.

Also usually present are similarly formed transistors which are part of the external circuitry.

The abovesaid cells can be made with better optimization of the area used if there is applied a technology permitting self-aligning of the floating and control gates. In this case all the silicon area of the control gate can be used for capacitive coupling of the floating and control gates, optimizing the writing and cancellation operations of the cell.

A known technique for making memory cells with self-aligned layers of polycrystalline silicon and associated selection and circuitry transistors calls for the following sequence of operations: (a) deposit of a first layer of polycrystalline silicon on a substrate of monocrystalline silicon furnished in advance with field oxide and gate oxide, (b) definition and etching of said first silicon layer, (c) growth of a thin layer of oxide on said first silicon layer, (d) etching of said oxide layer over the entire area intended for formation of the transistors, (e) deposit of a second layer of polycrystalline silicon and (f) final etching of the two layers of polycrystalline silicon and of the intermediate oxide layer outside the zones intended for formation of the memory cell and transistors.

In this manner there is obtained a resulting structure including one or more memory cells having two self-aligned layers of polycrystalline silicon with interposed oxide and associated selection and circuitry transistors with two self-aligned and short-circuited layers of polycrystalline silicon.

This manufacturing technique displays possible criticality with regard to the final etching of the two layers of silicon and the intermediate oxide. If the first etching step of the second silicon layer is continued until it reaches the gate oxide in the regions without intermediate oxide, there occurs during the etching steps of the intermediate oxide and of the first silicon layer an undesirable excavation of the monocrystalline silicon substrate.

To obviate this inconvenience there has been proposed a process variant which calls for stopping the etching of the second silicon layer before it uncovers the gate oxide, thus leaving part of the first silicon layer protecting the latter in the regions having shortcircuited silicon. The subsequent etching of the intermediate oxide and of the first oxide layer thus takes place without excavation of the substrate.

This solution requires however the availability of a refined etching technology permitting sizing of the necessary overetchings.

In view of this state of the art the object of the present invention is to develop a process for the manufacture of structures having E$^2$PROM memory cells with self-aligned layers and associated transistors free of the aforesaid drawbacks.

In accordance with the invention said object is achieved by a process which differs from the abovementioned known art by the fact that (a) at least in the area intended for the formation of the selection transistor etching of the intermediate oxide layer is limited to the formation of a small window narrower than that desired for said transistor and (b) final etching of the two silicon layers and of the intermediate oxide layer is performed using a mask formed in such a manner as to superimpose on the second silicon layer, at least in the selection transistor area, a covering wider than that of the corresponding window of the intermediate oxide layer.

In this manner, i.e. by creating between the mask in the transistor zone and the edges of the oxide layer at the sides of the related window a partial superimposition which of course must be greater than the alignment tolerance of the exposure machine used, it is possible to offer to the final etching in the unprotected zones the same combinations of layers to be etched. This avoids the drawbacks of the known art and simplifies the etching technology itself, protecting from overetching the monocrystalline silicon of the substrate.

Three possible forms of execution of the process in accordance with the invention are illustrated as examples in the annexed drawings wherein:

FIGS. 1-5 show the various operational steps of the process in accordance with the invention in one form of execution thereof, FIGS. 6-10 show alternative operational steps of the process in accordance with the invention in another form of execution thereof, and FIGS. 11-14 show alternative operational steps of the process in accordance with the invention in still another form of execution thereof.

The process illustrated in FIGS. 1-5 provides that on a substrate 1 of monocrystalline silicon having field oxide areas 2 and a thin layer of gate oxide 3 there is initially deposited a first layer 4 of polycrystalline silicon (FIG. 1).

Figure 2:
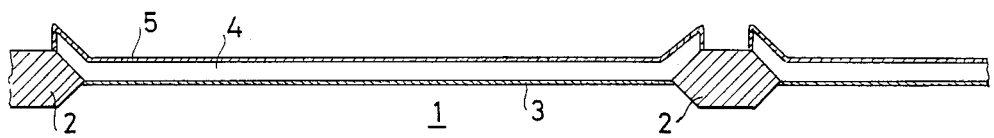

By appropriate resist masking there is subsequently performed etching and the resulting removal of the silicon layer 4 corresponding to the oxide areas 2. On the residual layer there is then grown a thin layer of silicon oxide 5 (FIG. 2).

Figure 3:
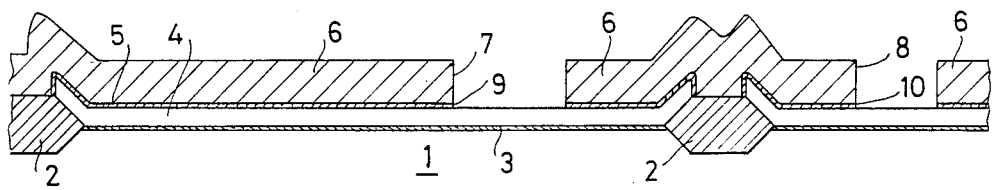
Figure 4:
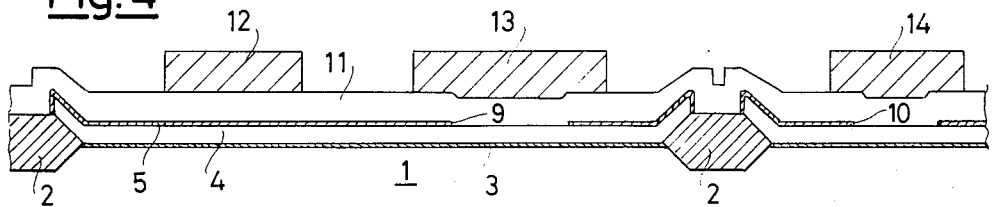

By employing suitable resist masking 6 having windows 7 and 8 there is subsequently performed etching of the oxide 5 in which there are opened small windows 9 and 10 in the zones intended for formation of the selection and circuitry transistors (FIG. 3).

The resist 6 is then removed and there is deposited a second poycrystalline silicon layer 11 on which is applied another resist masking made up of three areas 12, 13 and 14 the position and width of which correspond to the position and width desired for the memory cell and the selection and circuitry transistors. As may be seen from FIG. 4 the resist coverings 13 and 14 are wider than the corresponding windows 9 and 10 made in the oxide 5. The overlap of said coverings 13 and 14 in relation to the oxide layer 5 is at least equal to the alignment tolerance due to the exposure machine used.

Final etching is then performed of the double silicon layer 4 and 11 and of the intermediate oxide 5 performed with a first etching step of the top silicon layer 11 and a second etching step of the oxide 5 and of the bottom layer of silicon 4.

Figure 5:
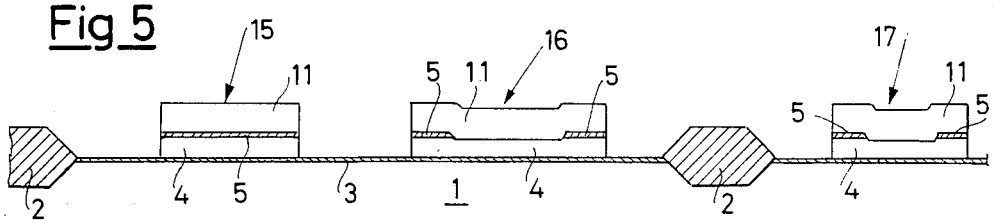

As it meets layers of the same composition the etching originates uniform removal of material at the sides of the cell area 15, of the selection transistor 16 and of the circuitry transistor 17 as shown in FIG. 5.

The process illustrated in FIGS. 1–5 solves the problems of the known art but has the drawback of not providing the components of minimal dimensions provided by photolithographic technology. Indeed, the minimum width of the components is determined by the minimum apertures 7, 8 allowed by the lithographic process used and by the etchings, plus twice the alignment tolerance and an additional margin due to the dimension control tolerance of the strip of polycrystal to be defined.

Figure 6:
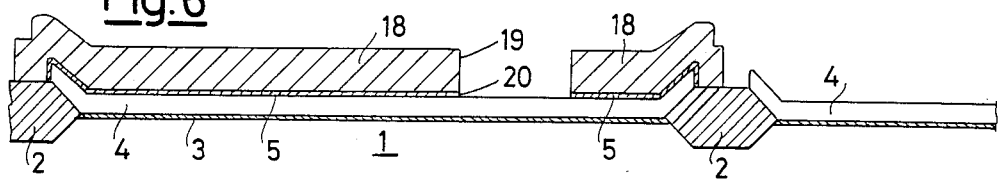

This limitation can be eliminated for the peripheral circuitry (transistor 17) by appropriate masking. More precisely, as shown in FIG. 6 the structure of FIG. 2 is covered, with a resist mask 18 which leaves uncovered a small area 19 in the zone intended for the selection transistor 16 as well as the entire area intended for the circuitry transistor 17. The oxide layer 5 is then removed in a small area 20 underlying the open area 19 of the resist 18 and over the entire area of the circuitry transistor 17.

Once the resist 18 has been removed there is deposited the second silicon layer 11 on which is grown a second oxide layer 21. On the resulting structure (FIG. 7) there is applied another resist masking formed again of three areas 12, 13 and 14 like those illustrated in FIG. 4. In this case too, the resist covering 13 is wider than the underlying window 20 of oxide 5, the overlap being at least equal to the alignment tolerance of the exposure machine used.

Figure 8:
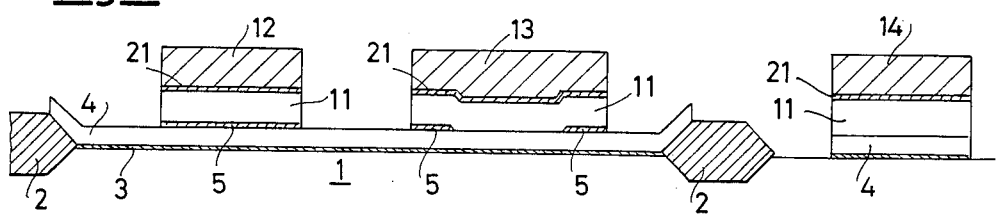

There follows a first step of etching of the second oxide layer 21, of the second silicon layer 1 and of the first oxide layer 5 stopping at a point corresponding to the first silicon layer 4 as concerns the cell and selection transistor areas. Lacking the protection of the oxide 5 the etching continues up to the gate oxide 3 at the sides of the circuitry transistor area (FIG. 8).

Figure 9:
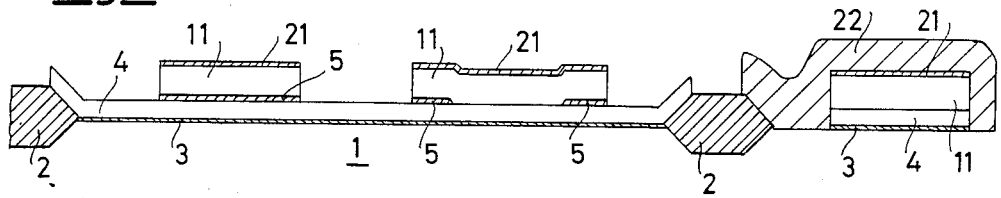

The resist 12, 13 and 14 is then removed and on the circuitry area 17 is applied another resist mask 22 (FIG. 9).

Figure 10:
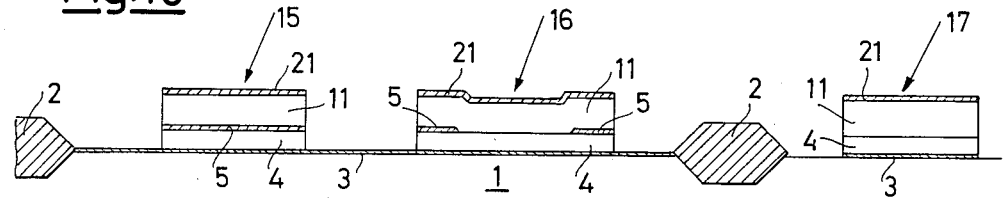

Finally the etching is completed at the sides of the cell area 15 and the selection transistor area 16 until there is obtained the final result shown in FIG. 10 after removal of the mask 22. In this last step the second oxide layer 21 is used as a mask for the cell 15 and the transistor 16.

Figure 7:
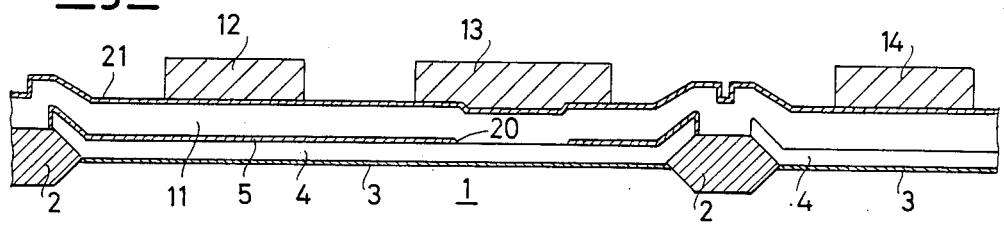
Figure 11:
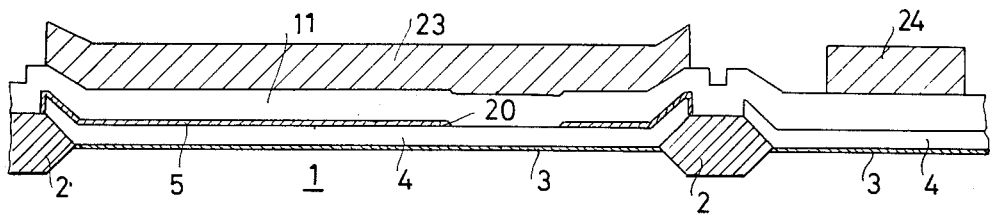

As another alternative, if it is desired to save the second oxide layer 21, the process in accordance with the invention could use in place of the mask 12, 13, 14 of FIG. 7, after the step shown in FIG. 6 and subsequent deposit of the second silicon layer 11, the mask illustrated in FIG. 11, which is composed of a single segment 23 on the cell and selection transistor areas and of a small segment 24 on the circuitry transistor area.

Figure 12:
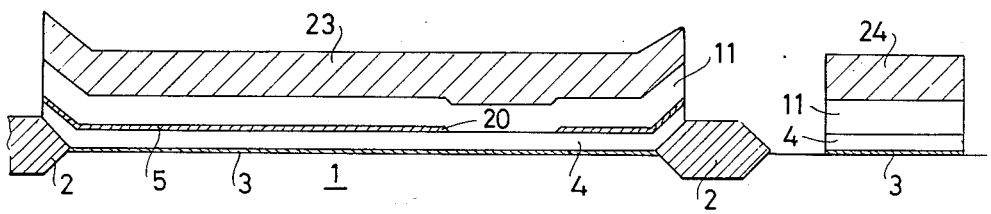
Figure 13:
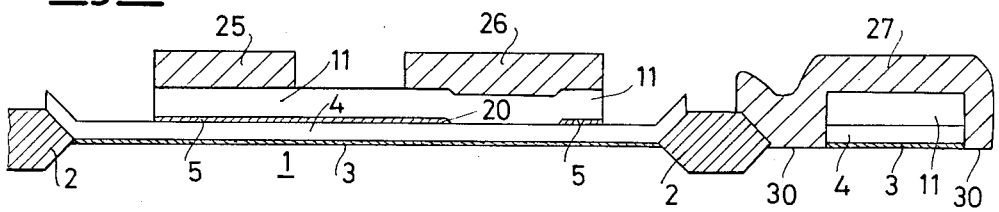

Etching is then performed of the two silicon areas 11 and 4 and of the gate oxide 3 in the unprotected intermediate area (FIG. 12).

After removal of the resist 23, 24 there is applied another masking 25, 26 and 27 of which the part 26 is again wider than the underlying oxide window 20. The part 27 covers in turn the entire area of the circuitry transistor (FIG. 13) including the adjacent uncovered zones of monocrystalline silicon (30).

Figure 14:
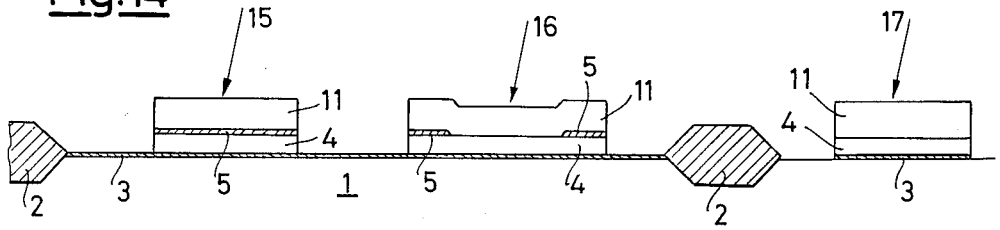

Finally the final etching, of the top layer of silicon 11 and oxide 5 (FIG. 13) at the sides of the protected zones and then of the bottom layer of silicon 4, leads to the final result shown in FIG. 14.

We claim:

1. Process for making structures including $E^2PROM$ nonvolatile memory cells with self-aligned layers of silicon and associated selection and circuitry transistors comprising the steps of:
   a. a first layer of polycrystalline silicon on a substrate of monocrystalline silicon furnished in advance with field oxide and gate oxide,
   b. etching said first silicon layer,
   c. growing a thin intermediate layer of oxide on said first silicon layer,
   d. etching said intermediate oxide layer in the areas intended for formation of the selection and circuitry transistors, wherein said etching forms a narrow window for at least each selection transistor;
   e. depositing a second layer of polycrystalline silicon, and
   f. performing a final etching of the two silicon layers and of the intermediate oxide layer at the sides of the cell and transistor areas using a mask formed in such a manner as to superimpose on the second silicon layer, at least in the selection transistor areas, a covering wider than the corresponding window in the intermediate oxide layer.

2. Process in accordance with claim 1 wherein said etching of the intermediate oxide layer forms a narrow window for each said circuitry transistor, and said final etching of the two silicon layers and of the intermediate oxide layer are performed using a mask formed in such a manner as to superimpose on the second silicon layer a covering wider than the corresponding window in the intermediate oxide layer for each circuitry transistor.

3. Process in accordance with claim 1 further comprising between the steps of depositing the second silicon layer and performing the final etching of the two silicon layers and the intermediate oxide layer the step of growing an oxide layer over the second silicon layer.

4. Process for making structures including $E^2PROM$ nonvolatile memory cells with self-aligned layers of silicon and associated selection and circuitry transistors comprising the steps of:
   a. depositing a first layer of polycrystalline silicon on a substrate of monocrystalline silicon furnished in advance with field oxide and gate oxide,
   b. etching said first silicon layer,
   c. growing a thin intermediate layer of oxide on said first silicon layer,
   d. etching said intermediate oxide layer in the areas intended for formation of the selection and circuitry transistors, wherein said etching forms a narrow window for at least each selection transistor;
   e. growing an oxide layer over the second silicon layer, and
   f. performing a final etching that includes the steps of (1) masking the cell area, selection transistor area and circuitry transistor area; (2) etching the oxide layer grown over the second silicon layer, the second silicon layer and the intermediate oxide layer at the sides of the cell areas, the sides of the selection transistor areas, and etching the oxide layer grown over the second silicon layer, the two silicon layers and the gate oxide at the sides of the circuitry transistor areas; (3) removing the preceding masking and applying a further masking that superimposes a covering over the selection transistor areas that is wider than the oxide windows associated therewith; and (4) etching the first silicon layer at the sides of the cell and selection transistor areas.

5. Process for making structures including E$^2$PROM nonvolatile memory cells with self-aligned layers of silicon and associated selection and circuitry transistors comprising the steps of:

a. depositing a first layer of polycrystalline silicon on a substrate of monocrystalline silicon furnished in advance with field oxide and gate oxide,
  b. etching said first silicon layer,
  c. growing a thin intermediate layer of oxide on said first silicon layer,
  d. etching said intermediate oxide layer in the areas intended for formation of the selection and circuitry transistors, wherein said etching forms a narrow window for at least each selection transistor;
  e. depositing a second layer of polycrystalline silicon, and
  f. performing a final etching that includes the steps of (1) covering the entire zone that includes the cell and selection transistor areas and the circuitry transistor areas and gate oxide in an unprotected intermediate region; (2) removing the preceding covering and applying a masking covering to the cell and selection transistor areas and to the circuitry transistor areas and to adjacent uncovered monocrystalline silicon zones, wherein said masking covering superimposes on the second silicon layer, at least in the selection transistor areas, a covering wider than the window that corresponds thereto; and (3) etching the second silicon layer and the intermediate oxide layer and then the first silicon layer at the sides of the protected areas.

* * * * *